(12) United States Patent
Yang et al.

(10) Patent No.: US 7,609,543 B2
(45) Date of Patent: Oct. 27, 2009

(54) METHOD AND IMPLEMENTATION OF STRESS TEST FOR MRAM

(75) Inventors: Hsu Kai Yang, Pleasanton, CA (US); Lejan Pu, San Jose, CA (US); Perng-Fei Yuh, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 65 days.

(21) Appl. No.: 11/904,434

(22) Filed: Sep. 27, 2007

(65) Prior Publication Data

US 2009/0086531 A1      Apr. 2, 2009

(51) Int. Cl.
*G11C 11/00*      (2006.01)
(52) U.S. Cl. .................. 365/158; 365/148; 365/201; 365/210.1
(58) Field of Classification Search .......... 365/158, 365/148, 171, 200, 201, 163, 210.1
See application file for complete search history.

(56) References Cited

U.S. PATENT DOCUMENTS

| 6,347,056 | B1 | 2/2002 | Ledford et al. |
| 6,760,865 | B2 | 7/2004 | Ledford et al. |
| 6,831,872 | B2 | 12/2004 | Matsuoka |
| 6,862,213 | B2 * | 3/2005 | Hamaguchi .................. 365/158 |
| 6,894,937 | B2 | 5/2005 | Garni et al. |
| 6,990,024 | B2 * | 1/2006 | Hidaka .................. 365/189.15 |
| 2007/0115717 | A1 | 5/2007 | Yang et al. |

* cited by examiner

*Primary Examiner*—David Lam
(74) *Attorney, Agent, or Firm*—Saile Ackerman LLC; Stephen B. Ackerman

(57) ABSTRACT

Voltage and current stress for magnetic random access memory (MRAM) cells can weed out potential early failure cells. Method and circuit implementation of such a stress test for a MRAM comprise coupling a stress test circuit to the read bus of the MRAM and stressing the Magnetic Tunnel Junctions (MTJS) by tying them to ground by activating isolation transistors associated with them. Read word lines control which MTjs are stressed Both the method and implementation can be used for any memory cells based on resistance differences, such as Phase RAM or Spin Valve MRAM.

29 Claims, 4 Drawing Sheets

METHOD AND IMPLEMENTATION OF STRESS TEST FOR MRAM

RELATED PATENT APPLICATION

This application is filed as U.S. patent application Ser. No. 11/284,299 on Nov. 21, 2005, which is herein incorporated by reference in its entirety.

BACKGROUND OF THE INVENTION

1. Field of the Invention

The invention relates to magnetic RAM (MRAM), or any memory cells based on resistance difference, and more particularly for improving reliability and overall yield by using stress testing.

2. Description of the Related Art

Stress testing of MRAMs (magnetic or magnetoresistive RAMs) has been attracting the attention of memory system designers because of the ultrathin layer of the insulator of about 1 nm (1 nanometer or 10 Angstrom). Control of the thickness is critical but the thickness will vary in the manufacturing process. Memory systems designers have come up with various methods of testing to weed out magnetic tunnel junctions which do not meet the required minimum thickness and which will lead eventually to failures. A common technique is voltage stress testing. A higher voltage than the standard voltage is applied to the MRAM which causes excess current to flow through the junction, stressing it and leading to failure. These failed cells can then be replaced with redundant cells.

U.S. patents which relate to testing of memories and MRAMs are:

U.S. Pat. No. 6,990,024 (Hidaka) discloses a MRAM with a circuit which determines the tunnel current depending on the manufacturing irregularity of the tunneling film thickness. Using current instead of voltage thus avoids excessive tunnel current. This method secures a data read margin to correspond to the manufacturing irregularity of the thickness of a tunneling film and can further provide a higher current than the normal one in a burn-in test.

U.S. Pat. No. 6,894,937 (Garni et al.) describes a circuit which provides a stress voltage to Magnetic Tunnel Junctions (MTJs) to provide a predetermined acceleration of aging compared to normal operation. The stress voltage is maintained at the desired voltage by a circuit that mocks the loading characteristics of the portion of the memory array being stressed.

U.S. Pat. No. 6,831,872 (Matsuoka.) discloses a means for determining whether the reference level stored in the reference cell is within a preset range after a number of read operations and correction means for correcting the reference level if not within a specified range. This U.S. Patent specifically addresses the testing of a Novel Resistance Control Nonvolatile RAM (RRAM), but points out that its method can also be employed for a MRAM.

U.S. Pat. No. 6,760,865 (Ledford et al.) teaches a Built-In Self-Test (BIST) controller having a sequencer which identifies the test algorithm that is to be performed. This U.S. Patent allows the testing of multiple memories which may be different regarding type, size, data widths, etc. and is geared towards Flash or Electrically Erasable arrays, but DRAM, SRAM, MRAM and FeRAM (Ferroelectric RAM) may be also used.

U.S. Pat. No. 6,347,056 (Ledford et al.) is similar to U.S. Pat. No. 6,760,865 above.

It should be noted that none of the above-cited examples of the related art address the need of stressing the cells of a MRAM with voltage and current above the normal operating conditions to weed out random failures and to replace these failed cells with redundant cells that passed the stress test. These needs are met by the invention, which provides a method and implementation to weed out said random failures and replaces these failed cells as will be apparent by the description and drawing of the present invention.

SUMMARY OF THE INVENTION

It is an object of at least one embodiment of the present invention to provide a method and circuits to stress cells of a MRAM with voltage and current above the normal operating conditions and to thus weed out failures.

It is another object of the present invention to replace these failed cells with redundant cells which passed the stress test.

It is yet another object of the present invention to significantly improve by these methods and circuits the reliability of MRAMs and the overall yield of the manufacturing process.

It is still another object of the present invention to provide a cost effective way of performing the stress test.

These and many other objects have been achieved by coupling a stress circuit to a bus of a MRAM which receives read data. The stress circuit then puts a stress voltage onto the bus, were the stress voltage is variable depending on the input to the stress circuit. The stress on the insulation layer of the Magnetic Tunnel Junction (MTJ) is applied by connecting all the selected MTJs to a reference potential, such as ground, through their isolation transistors. For stress testing, the write enabling transistors are gated off, read enabling transistors are gated on. The bit line bi-directional current drivers are in tri-state, i.e. in high impedance mode. Read sensing circuits such as pre-amp stages are turned off. The number of memory cells to be stressed can be chosen by appropriate control of the address decoding circuit, and only limited by the total power dissipation. In addition, the stress time can be varied to suit the application.

These and many other objects and advantages of the present invention will be readily apparent to one skilled in the art to which the invention pertains from a perusal of the claims, the appended drawing, and the following detailed description of the preferred embodiments.

BRIEF DESCRIPTION OF THE DRAWINGS

Use of the same reference number in different figures indicates similar or like elements.

DESCRIPTION OF THE PREFERRED EMBODIMENT

Fast write and read time, almost infinite endurance and radiation hardened characteristics of magnetic or magnetoresistive RAMs (MRAM) make it a very attractive universal RAM. The extremely thin tunnel oxide of the Magnetic Tunnel Junction (MTJ), approximately 10 Angstrom or thinner, presents challenges for both the reliability and manufacturing process control. Stressing the cells with voltage and current above the normal operating conditions can weed out random failures and can replace these failures with redundant cells that pass stress testing. Thus, the reliability of MRAM and overall yield of the manufacturing process is improved significantly. The present invention teaches the method and circuit implementation of performing such a stress test in a cost effective way.

Figure 1:
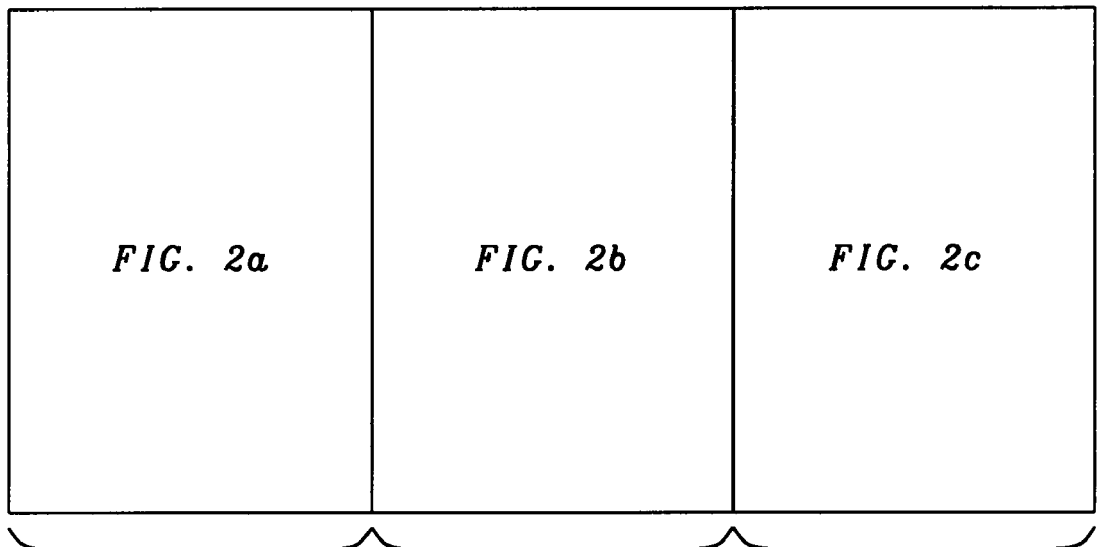
FIG. 1 is a block overview of the circuits of the present invention.
Figure 2A:
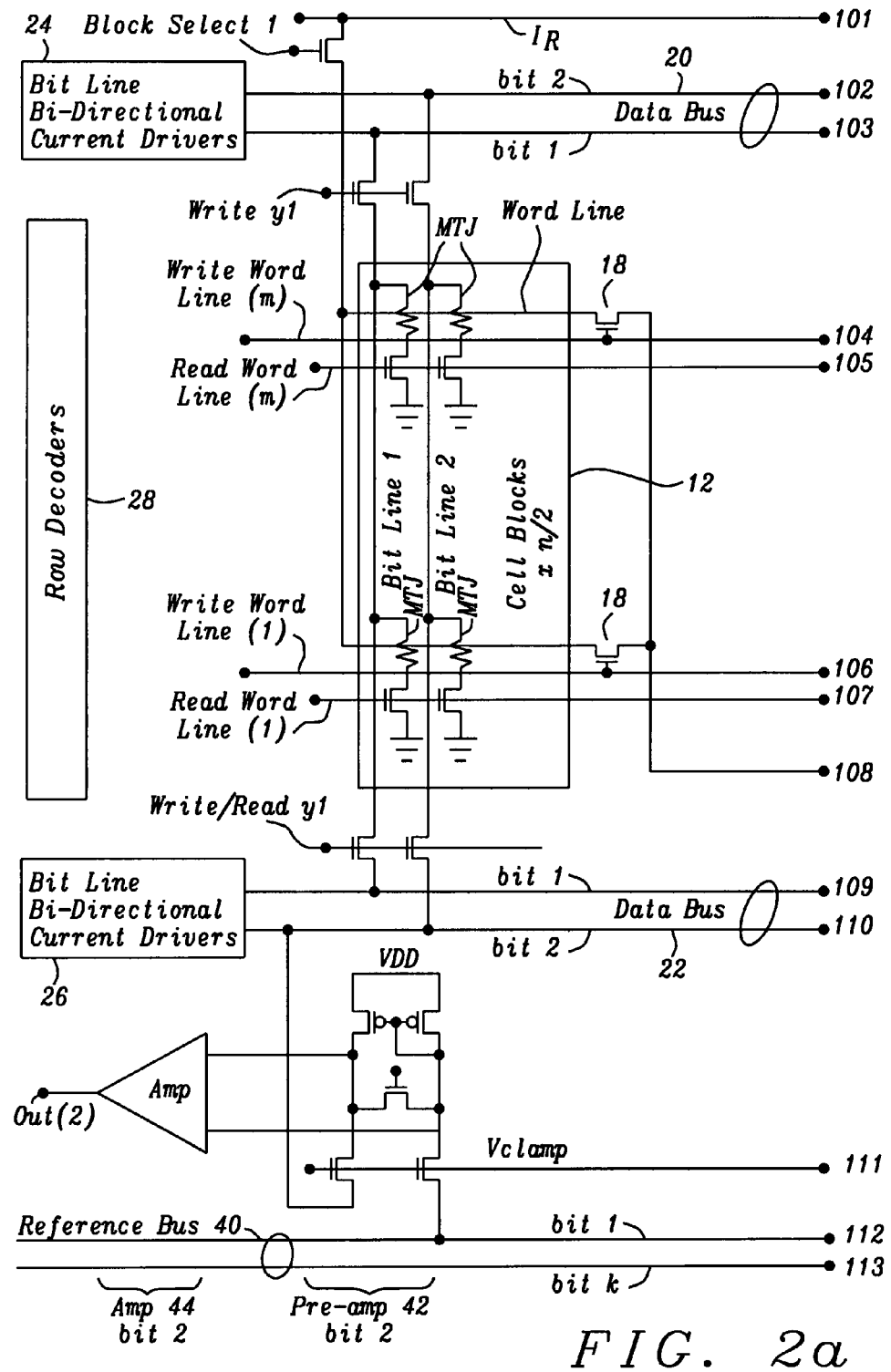
FIG. 2a is a detailed circuit diagram of the first half of the Cell Blocks of the MRAM, pre-amp and Amplifier for bit 2.
Figure 2B:
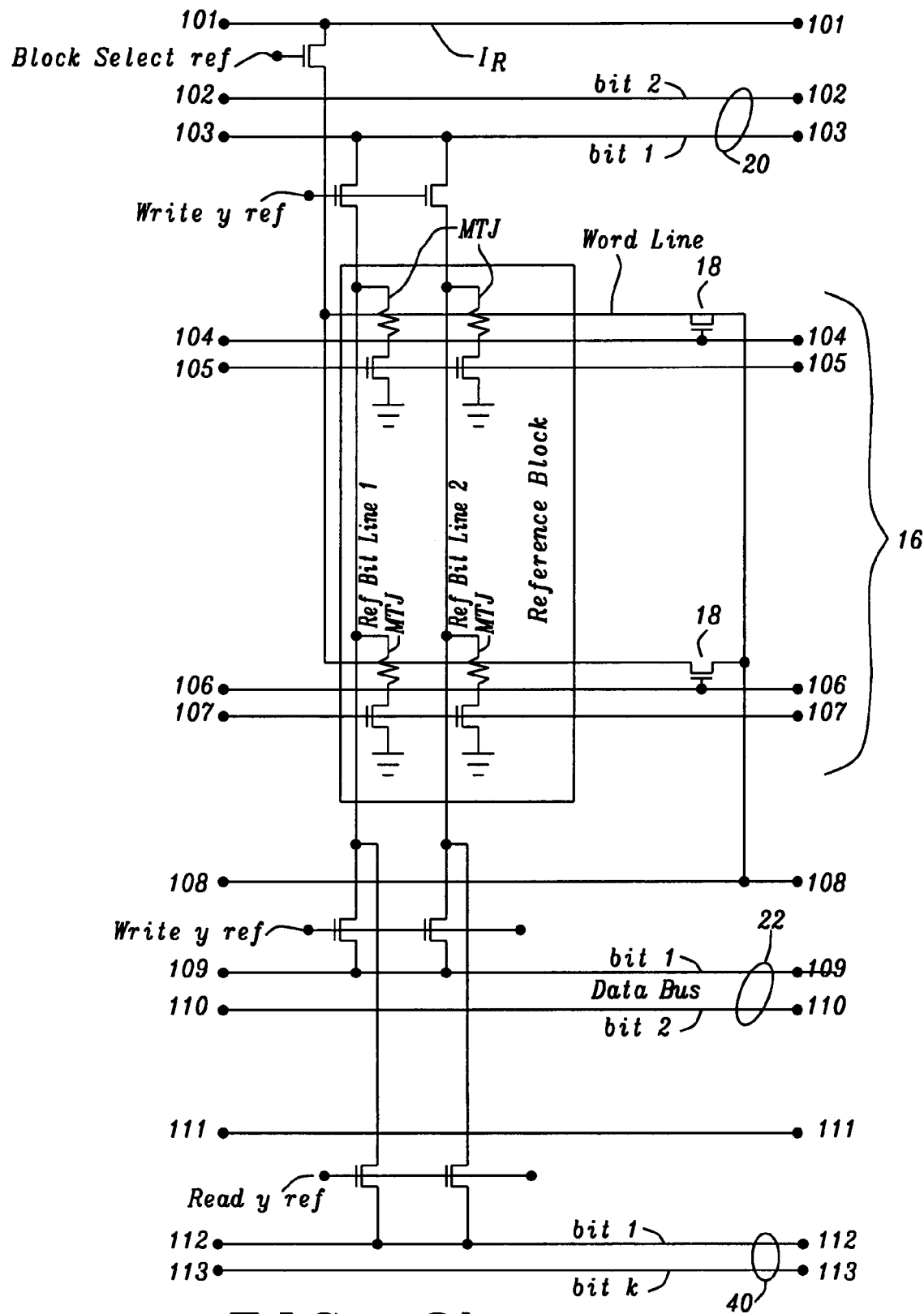
FIG. 2b is a detailed circuit diagram of the Reference Block of the MRAM.
Figure 2C:
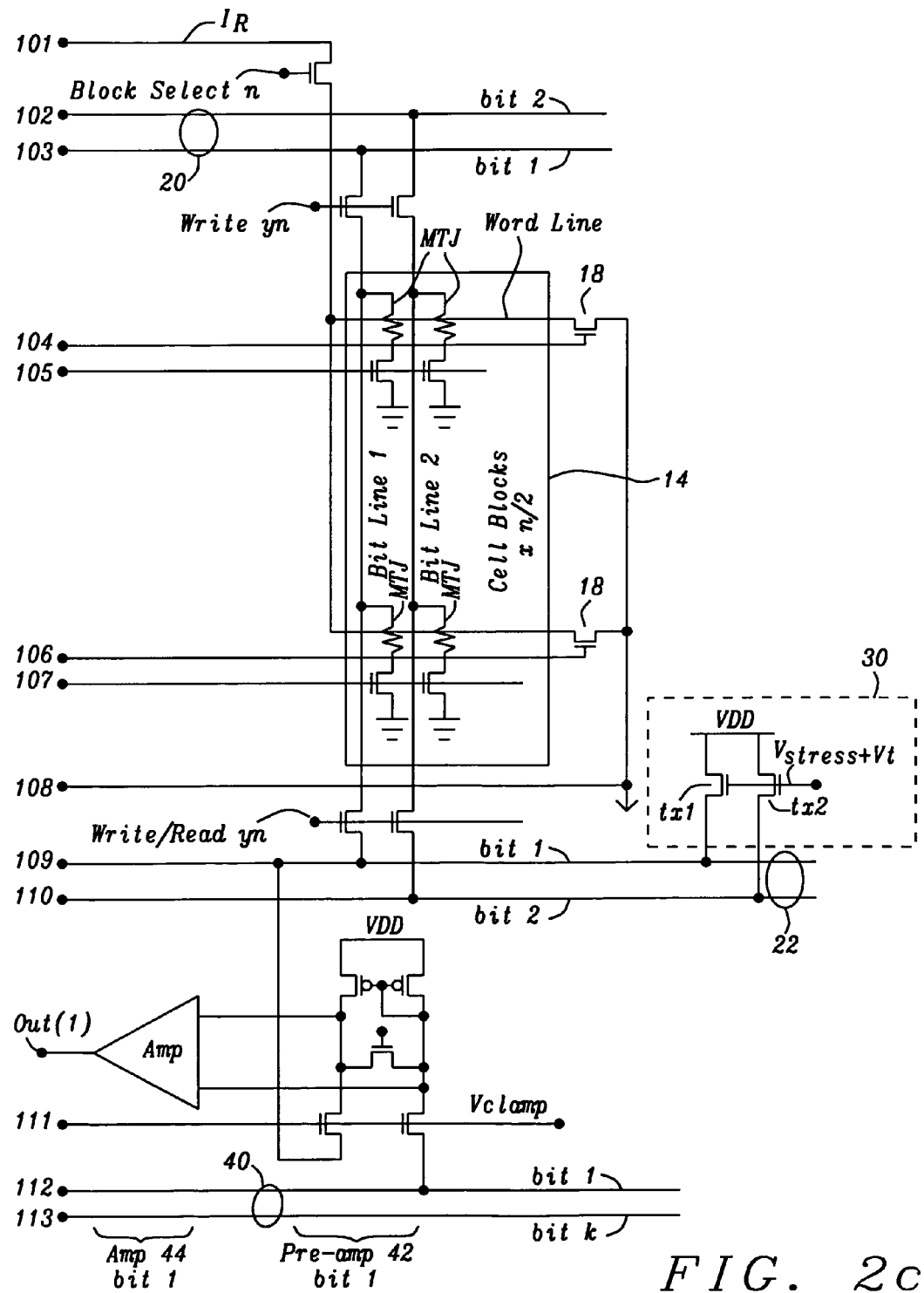
FIG. 2c is a detailed circuit diagram of the second half of the Cell Blocks of the MRAM, pre-amp and Amplifier for bit 1 and the Stress Circuit.

FIG. 1 is a block overview of the invention. FIGS. 2a-c show a typical MRAM array organized with n cell blocks and a reference block. Illustrated in FIGS. 2a, 2b and 2c are Cell Blocks 12 and 14, where Cell Block 12 is the first and Cell Block 14 is the last cell block (n). Each of the Cell Blocks 12 and 14 comprises w Bit Lines from Bit Line 1 to w, where bits 1 and 2 are shown. Block 12 shows the first n/2 Cell Blocks and Block 14 shows the remaining n/2 Cell Blocks by way of example. There is a single Reference Block 16 with k (k=½w) paired Reference Bit Lines 1 to k, where Reference Bit Lines 1 and 2 are shown, analogous to Cell Blocks 12 and 14. Cell Blocks 12, 14 and Reference Block 16 are in communication with Data Busses 20 and 22. They in turn are coupled to Bit Line Bi-Directional Current Drivers 24 and 26, respectively.

Each Cell Block from 1 to n is coupled via write transistors, the latter controlled by lines Write y1 to Write yn, to Data Bus 20. Shown for illustrative purposes are transistors, controlled by write y1, coupled to Bit Lines 1 to w for the first cell block (represented by Cell Block 12) and transistors, controlled by write yn, coupled to Bit Lines 1 to w for the $n^{th}$ cell block (represented by Cell Block 14). Each Cell Block 1 to n is further coupled via transistors for write/read, and controlled by lines Write/Read y1 to yn, to Data Bus 22. Shown for illustrative purposes are transistors, controlled by write/read y1, coupled to Bit Lines 1 to w for the first cell block (represented by Cell Block 12) and transistors, controlled by write/read yn, coupled to Bit Lines 1 to w for the $n^{th}$ cell block (represented by Cell Block 14). Reference Block 16 is coupled via transistors, controlled by lines Write y ref, to Data Busses 20 and 22, respectively. Shown for illustrative purposes are transistors, controlled by write y ref, coupled to paired Reference Bit Lines 1 to k.

Write Word Lines and Read Word Lines 1 to m cross Cell Blocks 12 and 14 and Reference Block 16 perpendicular to the Bit Lines and Reference Bit Lines. Coupled between Read Word Lines and Bit Lines or Reference Bit Lines are isolation transistors in series with the Magnetic Tunnel Junctions (MTJs) of the memory cells and ground, where the MTJs are shown symbolically as resistors. Each of the w Reference Bit Lines consists of a pair of k lines where the first pair consisting of lines 1 and 2 are shown in FIG. 2b by way of example, and which are coupled to reference MTJs having a resistive value of Rmin or Rmax, respectively. The reference MTJs are programmed to Rmin and Rmax to provide an average current of (Imin+Imax)/2 for the k paired Reference Bit Lines. Paired Reference Bit Lines 1 to k are coupled to the Reference Bus 40 bit 1 to k, respectively. Each Reference Bit Line is fed into 2 Pre-amps (42). Therefore the number of Reference Bit Lines is ½ of the number of Bit Lines w, and (Imin+Imax) is shared by 2 Pre-amps. See FIG. 2a (bit 2) and FIG. 2c (bit 1). Further shown are lines Block Select 1 and n and line Block Select ref which couple line $I_R$ to Cell Blocks 1 (12) and n (14) and the Reference Block (16), respectively. The gated $I_R$ line, now renamed Word Line, runs parallel to each Write Word Line 1 to m and is enabled by switching means. Switching means may imply devices such as a transistor or a transistor circuit, either of these in discrete form or in integrated circuits (IC). These devices are cited by way of illustration and not of limitation, as applied to switching means. In FIGS. 2a, 2b, 2c, the write word line is the gate of the aforementioned transistor. The Word Line is shown crossing the MTJ resistors. Row Decoder 28 decodes the addresses for the Write and Read Word Lines.

Stress circuit 30 is coupled to Data Bus 22. Vstress transistors tx1 to txw (where w is the number of tx transistors and equal to the w mentioned above) are shown coupled in an illustrative manner between a supply voltage VDD and lines 1 to w of Data Bus 22, respectively. The gates of transistors tx1 to txk are coupled to a control voltage Vstress+Vt. Where Vt stands for the threshold voltage of a transistor.

Inputs to Pre-amp 42 (bits 1 to w) are coupled between Data Bus 22 (bits 1 to w) and Reference Bus 40 (bits 1 to k). Coupled to Pre-amp 42 (bits 1 to w) are Sense Amp 44 (bits 1 to w) with outputs Out (bits 1 to w), respectively. Again by way of example, only Pre-amp 42 bit 1 and 2 and Sense Amp 44 bit 1 and 2 are shown. A line Vclamp controls Pre-amps 42. Paired Reference Bit Lines 1 to k are coupled to Reference Bus 40 (bits 1 to k) via read y ref transistors 1 to w which are activated by a Read y ref line.

Read Mode

In the normal Read Mode, the transistors controlled by Write/Read y select the Bit Lines of the block to be read and connect them to Data Bus 22. The transistors controlled by Read y ref connect the Reference Bit Lines to the Reference Bus 40. The Read Word Line selects which row of cells within the block is to be read. The cell data, either high or low resistance state, are compared with the average resistance of the reference cell by Pre-amp 42 and Sense Amp 44. Bit Lines and Data Bus 22 are typically biased around 300 mV for optimum MRAM cell operation. Such bias is achieved by using Vclamp transistors and applying a gate voltage Vstress+Vt of typically about 300 mV+Vt (threshold voltage).

Write Mode

In the normal Write Mode, the transistors controlled by Write/Read y1 to yn and Write y1 to yn are both on for the selected Block, so that bi-directional data currents can pass through the Bit Lines. Combined with the selected Write Word line current the desired Data is written into the selected row of cells in the selected Block.

Stress Test Mode

To implement the Stress Test, a set of Vstress transistors is coupled between the Vdd and Data Bus 22. These transistors are normally off during the normal Read and Write Mode. In Stress Mode Vclamp transistors and Write y transistors are off. Bit Line Bi-Directional Current Drivers are in tri-state. All the Write/Read y transistors are on. The Write y ref transistors coupled to Data Bus 22, and thus to the Vstress transistors, are also on; whereas the Write y ref transistors coupled to Data Bus 20 are off. The gate voltage of Vstress transistors is set at voltage Vstress+Vt, therefore Data Bus 22 and all the Bit Lines of n Blocks, including the Reference Bit Lines, are at stress voltage Vstress.

After activating the desired number of Read Word Lines, all the MTJs along the activated Read Word Lines are connected to ground (GND) through their isolation transistors. These MTJs are being stressed with above normal operating voltages and currents. We can measure the incremental current through the supply voltage VDD and divide that incremental current by the number of MTJs being stressed to arrive at the approximate current through each MTJ. The desired stress current can then be achieved by varying voltage Vstress. MTJs on unselected Read Word lines are not stressed. The stress voltage can be adjusted by Vstress and the Stress time can be adjusted by how long the selected Read Word Lines are kept on. The number of MTJs to be stressed is only limited by the total power dissipation. For a small MRAM array, all the MTJs can be stressed at the same time. For a large MRAM array, one can step through the Read Word Line addresses to stress all the cells.

Advantages of the Present Invention Include the Following:

The Stress test weeds out random failures;

MTJs on unselected words are not stressed;

The Stress time can be adjusted by how long the selected read word line is active;

The transistors which couple the bit lines to the stress voltage can be FETs;

A variable voltage can be coupled to the gates of the FETs;

The method is applicable to MTJ MRAMs, Phase Change RAMs or Spin Valve MRAMs.

While the invention has been particularly shown and described with reference to the preferred embodiments thereof, it will be understood by those skilled in the art that various changes in form and details may be made without departing from the spirit and scope of the invention.

What is claimed is:

1. A circuit for stressing memory cells, comprising:
a magnetic random access memory for storing data in resistance based memory cells, said resistance based memory cells accessed by word lines and bit lines, wherein said bit lines comprise a cell block and are in communication with first and second data buses;
wherein reference bit lines comprise a reference block and are in communication with said first and second data buses and a reference bus,
wherein cell data, read from said cell block, are compared with an average resistance of a reference cell of said reference block; and
a voltage stress circuit in communication with said magnetic random access memory, said voltage stress circuit applying a controlled stress voltage to said resistance based memory cells, said stress voltage stressing said resistance based memory cells by causing excess current to flow in those said resistance based memory cells subject to early failure.

2. The circuit of claim 1, wherein said voltage stress circuit is in communication with said data bus, said voltage stress circuit applying a stress voltage to said data bus, said voltage stress circuit further comprising:
switching means coupled between a voltage supply and said data bus, wherein control gates of said switching means are coupled to an adjustable voltage which supplies the test stress.

3. The circuit of claim 2, wherein said adjustable voltage equals said stress voltage plus a threshold voltage drop of said switching means.

4. The circuit of claim 2, wherein said switching means are field effect transistors.

5. The circuit of claim 2, wherein said stress voltage exceeds the voltage for normal operating conditions for said resistance based memory cells.

6. The circuit of claim 1, wherein said resistance based memory cells is one of Magnetic Tunnel Junction Magnetic Random Access Memory cells, Phase Change RAM cells or Spin Valve MRAM cells.

7. A circuit for stressing memory cells, comprising:
a magnetic random access memory for storing data in resistance based memory cells, said resistance based memory cells accessed by word lines and bit lines, wherein said bit lines form a cell block and where reference bit lines form a reference block,
wherein write word lines and read word lines cross said cell block and said reference block perpendicular to said bit lines and said reference bit lines, wherein said write word lines and said read word lines select which row of said resistance based memory cells is selected,
wherein write y lines, coupled between a first data bus and a first end of said bit lines, control access to said cell block in write mode,
wherein first reference write y lines, coupled between said first data bus and a first end of said reference bit lines, control to access said reference block in write mode,
wherein write/read y lines, coupled between a second data bus and a second end of said bit lines, control access to said cell block in write and read mode,
wherein second reference write y lines, coupled between said second data bus and a second end of said reference bit lines, control access to said reference block in write mode,
wherein first and second bit line bi-directional current drivers are coupled to said first and second data bus, respectively; and
a voltage stress circuit in communication with said second data bus, said stress voltage circuit, when activated, applying a controlled stress voltage to said resistance based memory cells, said stress voltage stressing said resistance based memory cells by causing excess current to flow in magnetic tunnel junctions of those said resistance based memory cells subject to early failure,
wherein stress switching means are coupled between a supply voltage and said second data bus, and where control gates of said stress switching means receive an adjustable voltage to generate the test stress.

8. The circuit of claim 7, wherein said adjustable voltage equals said stress voltage plus a threshold voltage drop of said stress switching means.

9. The circuit of claim 7, wherein said stress switching means are field effect transistors.

10. The circuit of claim 7, wherein said stress voltage exceeds a voltage for normal operating conditions for said resistance based memory cells.

11. The circuit of claim 7, wherein said resistance based memory cells are coupled between said second data bus, an isolation transistor, and a reference potential.

12. The circuit of claim 7, wherein said resistance based memory cells is one of Magnetic Tunnel Junction Magnetic Random Access Memory cells, Phase Change RAM cells or Spin Valve MRAM cells.

13. A circuit for stressing memory cells, comprising:
a magnetic random access memory for storing data in resistance based memory cells, said resistance based memory cells accessed by word lines and bit lines, wherein a first number of said bit lines form a cell block and where said first number of reference bit lines form a reference block,
wherein a second number of write word lines and read word lines cross said cell block and said reference block perpendicular to said bit lines and said reference bit lines, wherein said write word lines and said read word lines select which row of said resistance based memory cells is selected,
wherein write y lines control write switching means coupled between a first data bus and a first end of said bit lines to access said cell block in write mode,
wherein first reference write y lines control first reference write switching means coupled between said first data bus and a first end of said reference bit lines to access said reference block in write mode, wherein write/read y lines control write/read switching means coupled between a second data bus and a second end of said bit lines to access said cell block in write and read mode, wherein second reference write y lines control second reference write switching means coupled between said second data bus and a second end of said reference bit lines to access said reference block in write mode, wherein first and second bit line bi-directional current drivers are coupled to said first and second data bus, respectively; and a voltage stress circuit in communication with said second data bus, said voltage stress circuit, when activated, applying a controlled stress voltage to said resistance based memory cells, said controlled stress voltage stressing said resistance based memory cells by causing excess current to flow in magnetic tunnel junctions of those said resistance based memory cells subject to early failure, wherein stress switching means equal to said first number, are coupled between a supply voltage and said second data bus equal to said first number, and wherein control gates of said stress switching means are coupled to an adjustable voltage supply which supplies said controlled stress voltage.

14. The circuit of claim 13, wherein said adjustable voltage equals said stress voltage plus a threshold voltage drop of said stress switching means.

15. The circuit of claim 13, wherein said stress switching means are field effect transistors.

16. The circuit of claim 13, wherein said stress voltage exceeds a voltage for normal operating conditions for said resistance based memory cells.

17. The circuit of claim 13, wherein said resistance based memory cells are coupled between said second data bus, an isolation transistor, and a reference potential.

18. The circuit of claim 13, wherein when said voltage stress circuit is activated, said write y lines turn off said write switching means, said first reference write y lines turn off said first reference write switching means, said second reference write y lines turn on said second reference write switching means, and said write/read line turns on said write/read switching means.

19. The circuit of claim 13, wherein said resistance based memory cells is one of Magnetic Tunnel Junction Magnetic Random Access Memory cells, Phase Change RAM cells or Spin Valve MRAM cells.

20. A method of stress testing memory cells, comprising the steps of:
a) providing a magnetic random access memory, comprising a cell block and a reference block, where resistance based memory cells are the storage medium;
b) coupling a data bus to said cell block and said reference block of said magnetic random access memory for reading of data from and writing of data into said cell block and said reference block;
c) coupling a reference bus to said reference block of said magnetic random access memory for reading data from said reference block;
d) coupling a voltage stress circuit to said data bus;
e) activating said voltage stress circuit to apply a stress voltage and current above normal operating conditions to said resistance based memory cells;
f) making said stress voltage variable; and g) adjusting the duration during which the stress voltage and current are applied.

21. The method of claim 20, wherein cell data, read from said cell block, are compared with an average resistance of a reference cell of said reference block.

22. A circuit for stressing memory cells, comprising:
a magnetic random access memory for storing data in resistance based memory cells, said resistance based memory cells accessed by word lines and bit lines, wherein said bit lines form a cell block and are in communication with data buses;

wherein reference bit lines form a reference block and are in communication with said data buses and a reference bus, wherein cell data, read from said cell block, are compared with an average resistance of a reference cell of said reference block; and a current stress circuit in communication with said magnetic random access memory, said current stress circuit applying a controlled stress current to said resistance based memory cells, said stress current stressing said resistance based memory cells by causing excess current to flow in those said resistance based memory cells subject to early failure.

23. The circuit of claim 22, wherein said current stress circuit is in communication with said data bus, said current stress circuit applying a stress current to said data bus, said current stress circuit further comprising:
switching means coupled between a voltage supply and said data bus, wherein control gates of said switching means are coupled to an adjustable current which supplies the test stress.

24. The circuit of claim 23, wherein said stress current exceeds the current for normal operating conditions for said resistance based memory cells.

25. The circuit of claim 22, wherein said resistance based memory cells is one of Magnetic Tunnel Junction Magnetic Random Access Memory cells, Phase Change RAM cells or Spin Valve MRAM cells.

26. A circuit for stressing memory cells, comprising:
a magnetic random access memory for storing data in resistance based memory cells, said resistance based memory cells accessed by word lines and bit lines, wherein said bit lines form a cell block and where reference bit lines form a reference block, wherein write word lines and read word lines cross said cell block and said reference block perpendicular to said bit lines and said reference bit lines, wherein said write word lines and said read word lines select which row of said resistance based memory cells is selected, wherein write y lines, coupled between a first data bus and a first end of said bit lines, control access to said cell block in write mode, wherein first reference write y lines, coupled between said first data bus and a first end of said reference bit lines, control to access said reference block in write mode, wherein write/read y lines, coupled between a second data bus and a second end of said bit lines, control access to said cell block in write and read mode, wherein second reference write y lines, coupled between said second data bus and a second end of said reference bit lines, control access to said reference block in write mode, wherein first and second bit line bi-directional current drivers are coupled to said first and second data bus, respectively; and a current stress circuit in communication with said second data bus, said current stress circuit, when activated, applying a controlled stress current to said resistance based memory cells, said stress current stressing said resistance based memory cells by causing excess current to flow in magnetic tunnel junctions of those said resistance based memory cells subject to early failure, wherein stress switching means are coupled between a supply voltage and said second data bus, and where control gates of said stress switching means receive an adjustable current to generate the test stress.

27. The circuit of claim 26, wherein said stress current exceeds a current for normal operating conditions for said resistance based memory cells.

28. The circuit of claim 26, wherein said resistance based memory cells are coupled between said second data bus, an isolation transistor, and a reference potential.

29. The circuit of claim 26, wherein said resistance based memory cells is one of Magnetic Tunnel Junction Magnetic Random Access Memory cells, Phase Change RAM cells or Spin Valve MRAM cells.

* * * * *